United States Patent [19]
Song

[11] Patent Number: 5,818,894
[45] Date of Patent: Oct. 6, 1998

[54] HIGH SPEED BARREL SHIFTER

[75] Inventor: Sung-jin Song, Kyungki-do, Rep. of Korea

[73] Assignee: Samsung Electronics, Co., Ltd., Suwon, Rep. of Korea

[21] Appl. No.: 771,731

[22] Filed: Dec. 20, 1996

[30] Foreign Application Priority Data

Dec. 29, 1995 [KR] Rep. of Korea .................. 1995/66881

[51] Int. Cl.⁶ .................................................. G11C 19/00
[52] U.S. Cl. ................................ 377/69; 377/70; 377/75; 377/79
[58] Field of Search ................................ 377/69, 70, 74, 377/75, 79, 81

[56] References Cited

U.S. PATENT DOCUMENTS 5,265,259  11/1993  Satou et al. ............................... 377/69
5,510,740   4/1996  Farrell et al. ............................ 327/115

FOREIGN PATENT DOCUMENTS

1591072   9/1990   U.S.S.R. .................................. 377/70

*Primary Examiner*—Margaret Rose Wambach
*Attorney, Agent, or Firm*—Marger, Johnson, McCollom & Stolowitz P.C.

[57] ABSTRACT

A high speed barrel shifter in which fill input data is especially added. The high speed barrel shifter comprises: a first multiplexer having a first and a second input terminals for receiving double word and input data, thereby producing fill data at a first multiplexer output terminal responsive to first and second fill data control signals (C1, C2); a second multiplexer coupled to said first multiplexer for receiving the fill data output from said first multiplexer and the input data and producing first shifted data by shifting the input data by a selectable number of either 0 or 4 bits and by replacing selectable input data bits with selectable fill data bits responsive to a first shift control signal (M0); a third multiplexer coupled to said second multiplexer for receiving the first shifted data output from said second multiplexer and producing second shifted data by shifting the first shifted data by a selectable number of either 0, 1, 2, or 3 bits responsive to second and third shift control signals (M1, M2); and a fourth multiplexer coupled to said first and third multiplexer for receiving the fill data output from said first multiplexer and the second shifted data output from said third multiplexer and selecting output data responsive to a first and second output select control signals (F, H).

20 Claims, 5 Drawing Sheets

HIGH SPEED BARREL SHIFTER

BACKGROUND OF THE INVENTION

The present invention relates to a barrel shifter, and ore particularly, to a high speed barrel shifter in which fill input data is especially added.

Shifting operations are frequently used in the performance of computation in digital computers. Most large digital computers, often called main frames, have very elaborate shift circuits to perform the desired shifting at operations at high speed. Barrel shifter circuits typically perform shift left, shift right, or rotate operations. When a shift operation occurs, the place left empty by the shift operation is filled with either a 0 or a 1. In a conventional barrel shifter, a masking circuit is used to determine the appropriate data to fill the empty place. As a result, output data is delayed.

The addition of a masking circuit to the conventional barrel shifter requires additional circuitry including adding a filling portion and various logic circuits for generating the various control signals necessary for proper barrel shifter operation.

SUMMARY OF THE INVENTION

Accordingly, it is an object of the present invention to provide a high speed barrel shifter in which logic circuitry is minimized.

It is another object of the present invention to improve shift and rotate speed by making available double word fill data and data to be shifted in parallel.

To achieve the above-mentioned object, a high speed barrel shifter is provided which comprises: a first multiplexer having a first and a second input terminals for receiving double word and input data, thereby producing fill data at a first multiplexer output terminal responsive to first and second fill data control signals (C1, C2); a second multiplexer coupled to said first multiplexer for receiving the fill data output from said first multiplexer and the input data and producing first shifted data by shifting the input data by a selectable number of either 0 or 4 bits and by replacing selectable input data bits with selectable fill data bits responsive to a first shift control signal (M0); a third multiplexer coupled to said second multiplexer for receiving the first shifted data output from said second multiplexer and producing second shifted data by shifting the first shifted data by a selectable number of either 0, 1, 2, or 3 bits responsive to second and third shift control signals (M1, M2); and a fourth multiplexer coupled to said first and third multiplexer for receiving the fill data output from said first multiplexer and the second shifted data output from said third multiplexer and selecting output data responsive to a first and second output select control signals (F, H).

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, wherein.

DETAILED DESCRIPTION OF THE INVENTION

Figure 1:
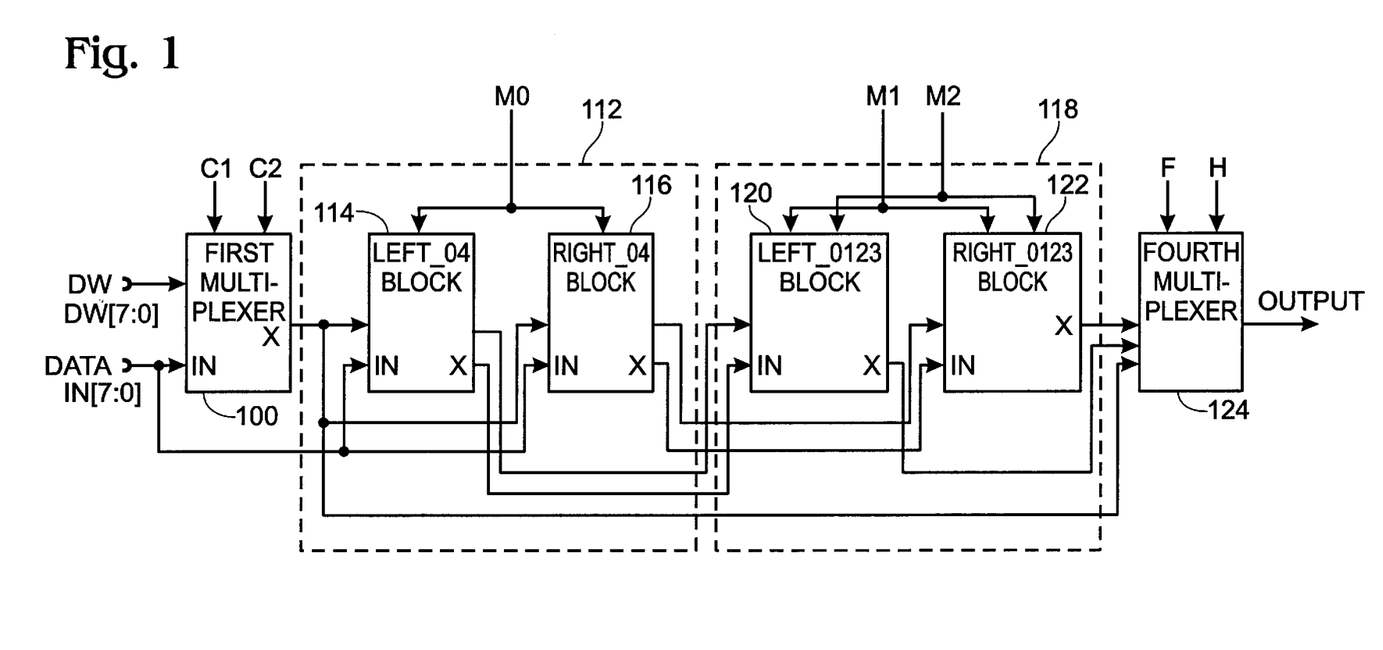
FIG. 1 is a block diagram of an 8-bit barrel shifter according to the present invention.

The barrel shifter shown in FIG. 1 includes first multiplexer 100, second multiplexer 112, third multiplexer 118, and fourth multiplexer 124. First multiplexer 100 receives double word fill data DW, input data IN, and fill data control signals C1 and C2.

Second multiplexer 112 is coupled to first multiplexer 100 and receives input data IN and control signal M0. Second multiplexer 112 includes left_04 block 114 and right_04 block 116 for selecting the received data bits according to a 4-bit shift control signal M0. Left_04 block 114 shifts data left by either 0 or 4 bits. Right_04 block 116 shifts data right by either 0 or 4 bits.

Third multiplexer 118 is coupled to first and second multiplexers 100 and 112, respectively, and receives control signals M1 and M2. Third multiplexer 118 includes left_0123 block 120 and a right_0123 block 122 for selecting the received data bits according to shift control signals M1 and M2. Left_0123 block 120 left shifts data by 0, 1, 2, or 3 bits and right_0123 block 122 right shifts data by 0, 1, 2, or 3 bits.

Fourth multiplexer 124 is coupled to first and third multiplexers 100 and 118, respectively, and receives control signals F and H. Fourth multiplexer 124 is a typical multiplexer circuit well known in the art and not described in further detail.

The operation of the barrel shifter of FIG. 1 is as follows. Double word fill data DW and input data IN are input to first multiplexer 100. Fill data control signals C1 and C2 select fill data for filling the empty bit locations generated after a left or right shift operation on input data IN. Fill data control signals C1 and C2 have a data select function as shown in Table 1.

TABLE 1

| C1 | C2 | FUNCTION |
|----|----|----------|
| 0  | 0  | Fill a shifted empty place with 0. |
| 0  | 1  | Fill a shifted empty place with 1. |
| 1  | 0  | Fill a shifted empty place with data DW. |
| 1  | 1  | Rotate data IN. |

Second multiplexer 112 shifts data by 0 or 4 bits either right or left by activating right_04 block 116 or left_04 block 114, respectively, with control signal M0. Third multiplexer 118 shifts data received from second multiplexer 112 either right or left by 0, 1, 2, 3, or 4 bits depending on control signals M1 and M2. Fourth multiplexer 124 receives a control signal F and a shift direction signal H. If control signal F is 1, fourth multiplexer 124 outputs the fill data output from first multiplexer 100. If control signal F is 0, fourth multiplexer 124 selects the fill data of third multiplexer 118. Furthermore, when shift-direction control signal H is 1, fourth multiplexer 124 selects the left-shifted data for output, and when shift-direction control signal H is 0, the right-shifted data is selected for output.

Figure 2:
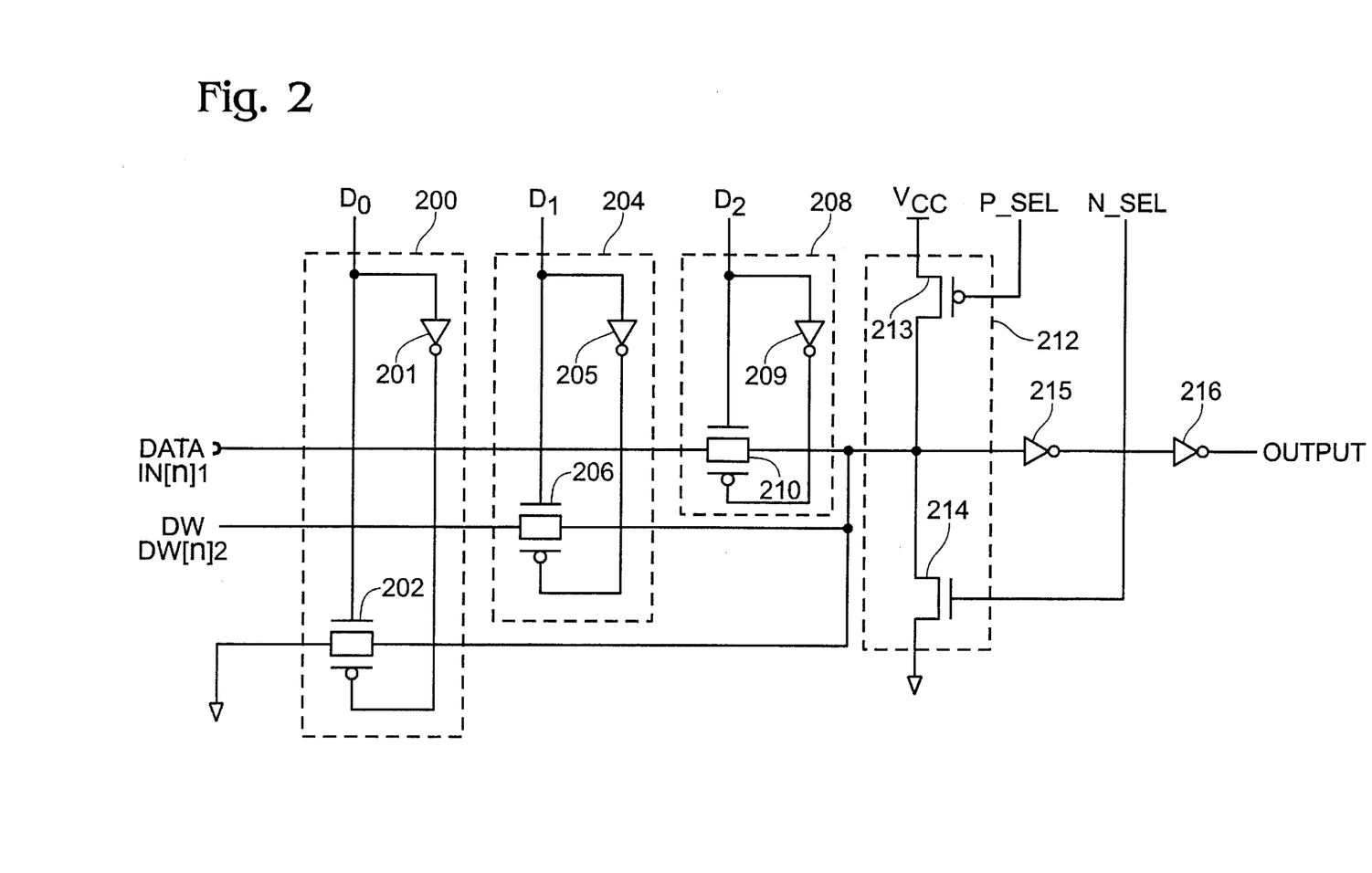
FIG. 2 is a circuit diagram of an F mux cell which is a component of the first multiplexer shown in FIG. 1.

FIG. 2 is a circuit diagram of an F mux cell which is a component of first multiplexer 100. The F mux cell shown in FIG. 2 includes a first control portion 200, a second control portion 204, a third control portion 208, and a fourth control portion 212. First control portion 200 comprises a transmission gate 202 and an inverter 201 for receiving control signal D0. Second control portion 204 comprises a transmission gate 206 and an inverter 205 for receiving control signal D1. Third control portion 208 comprises a transmission gate 210 and an inverter 209 for receiving control signal D2. Fourth control portion 212 includes a PMOS transistor 213 and an NMOS transistor 214 serially connected between a power source Vcc and ground potential. Control signal P_SEL is received at the gate of PMOS transistor 213 and control signal N_SEL is received at the gate of NMOS transistor 212. Both PMOS transistor 213 and NMOS transistor 214 are connected to the output of first, second, and third control portions 200, 204 and 208, respectively, at the drain of NMOS transistor 214.

Transmission gates 202, 206, and 210 include a pair of NMOS and PMOS transistors. Inverters 201, 205, and 209 are connected to the PMOS gate of transmission gates 202, 206, and 210, respectively, to thereby control switching. Control signals D0, D1, and D2 are connected to the NMOS gate of transmission gates 202, 206, and 210, respectively. Inverters 215 and 216 are serially connected to each other and connected to the drain of NMOS transistor 214.

The operation of the F mux cell shown in FIG. 2 is as follows. Data signals D0 to D2 and control signals P_SEL and N_SEL are decoded corresponding to fill data control signals C1 and C2 of first multiplexer 100 as shown in Table 2 where MSB refers to the most significant bit of input data IN. The circuit used to decode fill data control signals C1 and C2 to thereby generate signals D0 to D2, P_SEL, and N_SEL is a simple conventional logic circuit not shown or described further. As shown in Table 2, when fill data control signals C1 and C2 are 0 and 1, respectively, the empty place of the shifted data is filled with the most significant bit (MSB) of data IN. The MSB determines the value of signals P_SEL and N_SEL.

TABLE 2

| C1 | C2 | MSB | D0 | D1 | D2 | P_SEL | N_SEL | OUTPUT |
|----|----|-----|----|----|----|-------|-------|--------|
| 0  | 0  | X   | 1  | 0  | 0  | 1     | 0     | 0      |
| 0  | 1  | 0   | 0  | 0  | 0  | 1     | 1     | 0      |
| 0  | 1  | 1   | 0  | 0  | 0  | 0     | 0     | 1      |
| 1  | 0  | X   | 0  | 1  | 0  | 1     | 0     | DW     |
| 1  | 1  | X   | 0  | 0  | 1  | 1     | 0     | IN     |

F mux cell signal OUTPUT is in a logic high when control signals P_SEL and N_SEL are in a logic low state. Conversely, signal OUTPUT is in a logic low when control signals P_SEL and N_SEL are in a logic high state. The value of OUTPUT signal will depend on control signals D0, D1, and D2 when P_SEL is at a logic high and N_SEL is at a logic low. First control portion 212 conducts to ground potential when control signal D0 is in a logic high state producing a logic low at signal OUTPUT. Second control portion 214 conducts when control signal D1 is in a logic high producing double word fill data DW[n] at signal OUTPUT. Third control portion 208 delivers input data IN[n] to OUTPUT when control signal D2 is in a logic high state.

Figure 3A:
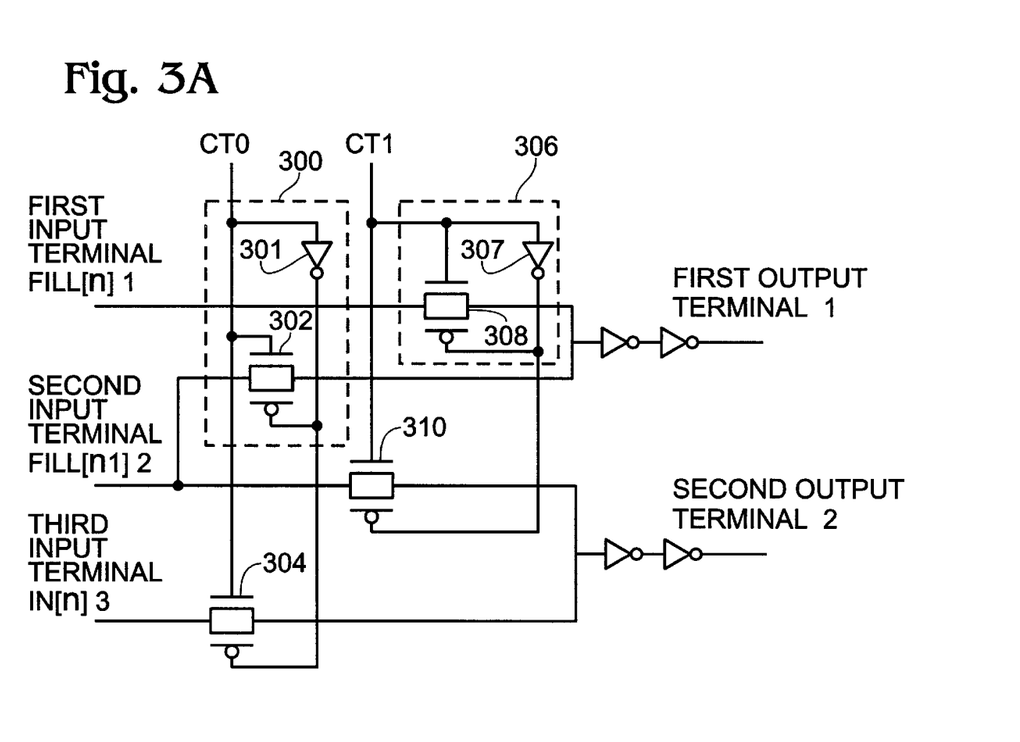
FIG. 3A is a circuit diagram of an F mux 2 cell which is a component of left_04 block and right_04 block shown in FIG. 1.

FIG. 3A is a circuit diagram of an F mux 2 cell which is a component of left_04 block and right_04 block shown in FIG. 1.

The F mux 2 cell comprises a fifth control portion 300 having an inverter 301 and a transmission gate 302. Fifth control portion 300 selects a data bit FILL[n] received to a second input terminal when control signal CT0 is in a logic high state and produces the selected data bit to a first output terminal. A sixth control portion 304 includes a transmission gate for selecting a data bit IN[n] received to a third input terminal when control signal CT0 is in a logic high state and produces the selected data bit to a second output terminal.

The F mux 2 cell further comprises a seventh control portion 306 having an inverter 307 and a transmission gate 308. Seventh control portion 307 selects a data bit FILL[n] received to a first input terminal when control signal CT1 is in a logic high state and produces the selected data bit to a first output terminal. Eighth control portion 310 includes a transmission gate for selecting a data bit received to a second input terminal when control signal CT1 is in a logic high state and produces the selected bit to a second output terminal.

Control signals CT0 and CT1 are decoded corresponding to control signal M0 (shown in FIG. 1). The circuit used to decode control signals CT0 and CT1 from control signal M0 is a simple conventional logic circuit not shown or described further. When control signal M0 is in a logic low state, control signals CT0 and CT1 become high and low, respectively. When control signal M0 is in a logic high state, control signals CT0 and CT1 become low and high, respectively.

Figure 3B:
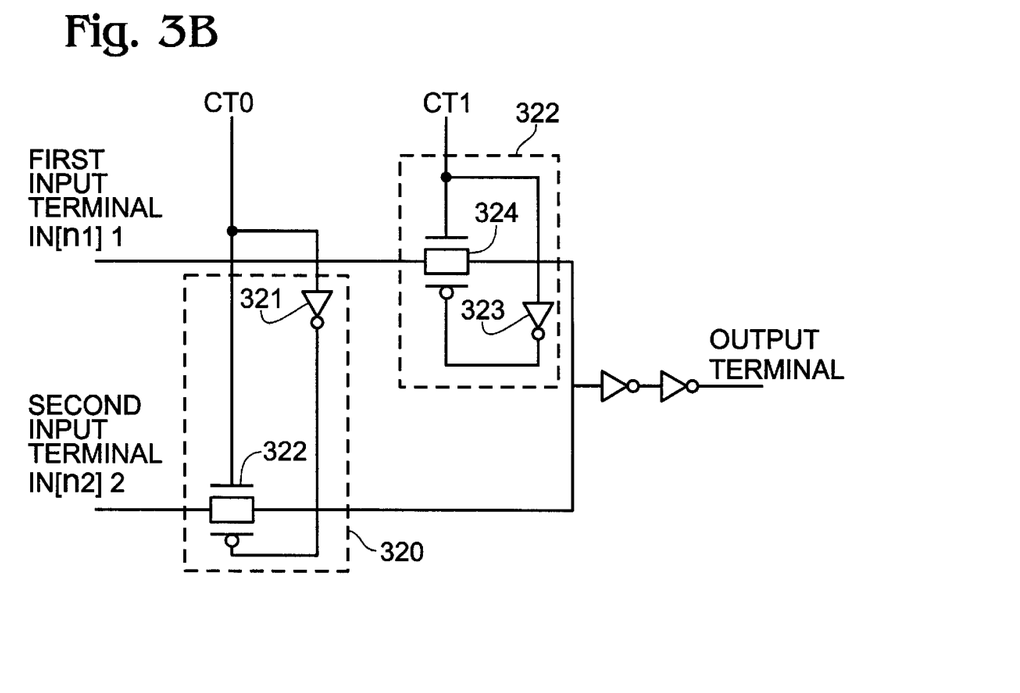
FIG. 3B is a circuit diagram of a mux 2 cell which is a component of left_04 block and right_04 block shown in FIG. 1.

Referring now to FIG. 3B, the mux 2 cell shown includes a ninth control portion 320 having an inverter 321 and a transmission gate 322. Ninth control portion 320 selects a data bit IN[n2] received to a second input terminal when control signal CT0 is in a logic high state and produces the selected data bit to an output terminal. A tenth control portion 324 having a transmission gate 324 and an inverter 323 selects a data bit IN[n1], received to a first input terminal when the CT1 is in a logic high state, and produces the selected data bit to the output terminal.

Figure 4A:
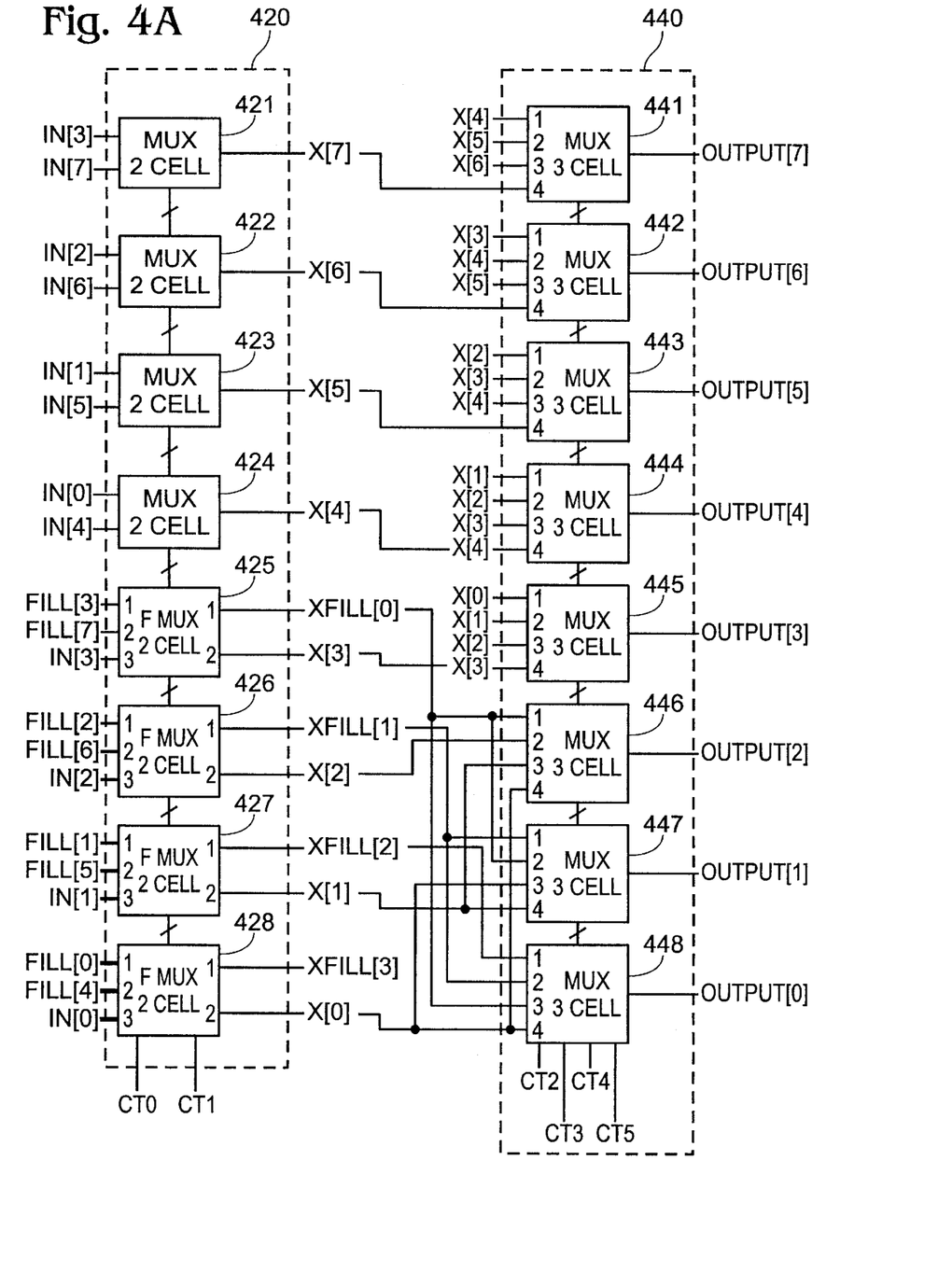
FIG. 4A is a connection diagram illustrating a left-shift operation.
Figure 4B:
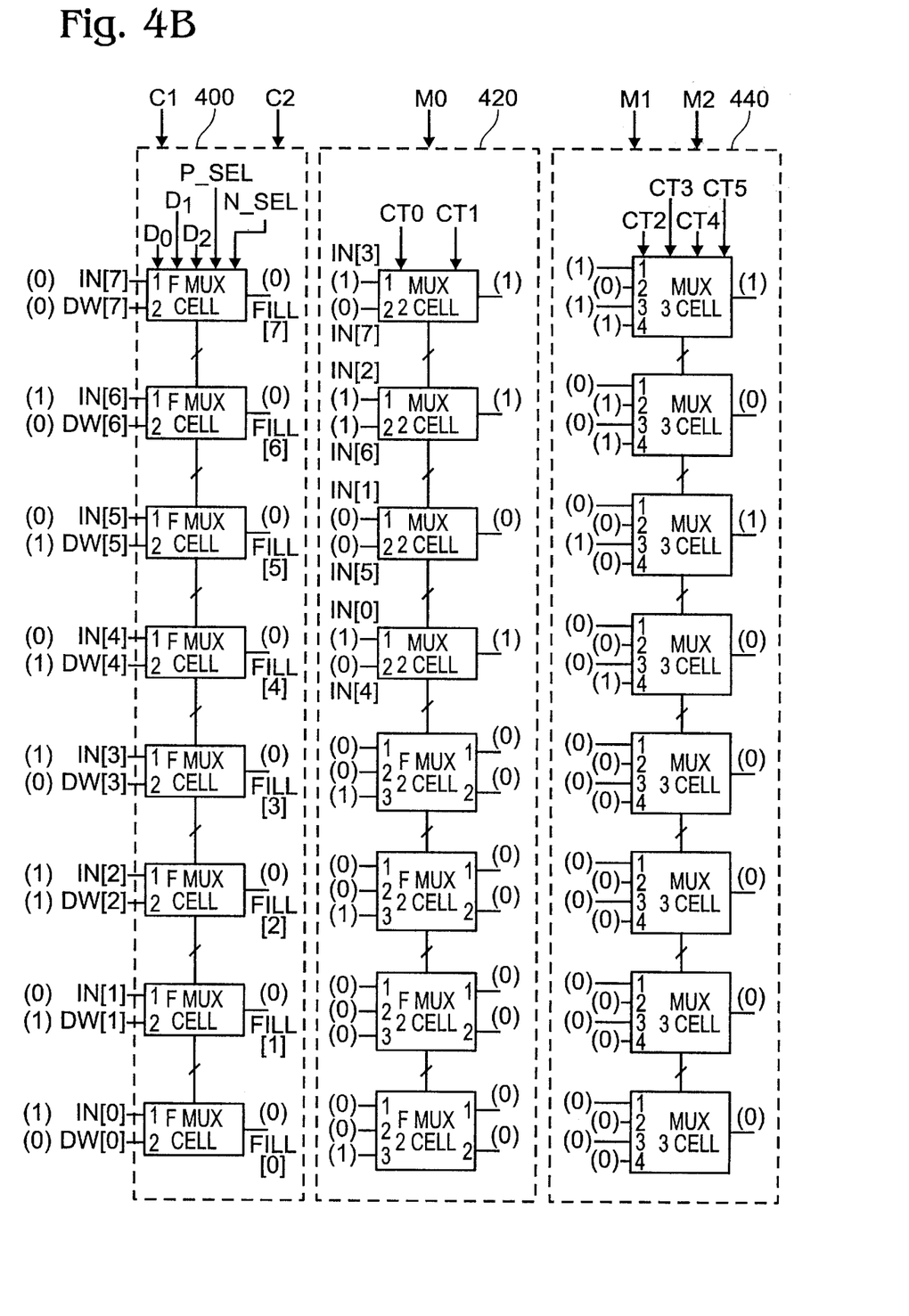
FIG. 4B is a connection diagram showing an embodiment in which input data is shifted left by 5 bits.

FIGS. 4A and 4B are connection diagrams of an embodiment of the present invention. In FIG. 4B, reference numeral 400 indicates 8 F mux cells which form first multiplexer 100 of FIG. 1. Reference numeral 420 indicates a left_04 block of FIG. 1 having 4 mux 2 cells 421 to 424 and 4 F mux cells 425 to 428. Reference numeral 440 indicates a left_0123 block having 8 mux 3 cells 441 through 448 for receiving 4 bits and selecting one bit. A mux 3 cell is a typical 4 to 1 multiplexer selecting a data bit received to an input terminal responsive to shift control signals CT2, CT3, CT4, and CT5. In FIG. 4A, partial connection of a left_04 block 420 and a left_0123 block 440 is indicated by a solid line; the remaining connections are indicated by a corresponding character.

The circuit shown in FIG. 4A operates as follows. Shift control signal M0 is decoded to CT0 and CT1 and input to left_04 block 420. Shift control signals M1 and M2 are decoded to CT2, CT3, CT4, and CT5 by a decoder (not shown) and input to left_0123 block 440.

Left_04 block 420 includes 4 mux 2 cells 421 to 424 for receiving bits of data IN and F mux 2 cells 425 to 428 for receiving bits of fill data FILL and IN. Each of F mux 2 cells 425 to 428 receives fill data output from the F mux cells which form first multiplexer 400.

FIG. 4B is a connection diagram showing how the present invention works in the case of 5 bit left shift operation. Reference character IN[2] indicates the second data bit of input data IN. Similarly, reference character DW[2] indicates the second bit of double word fill data DW. Also, (0) and (1) at the input and output terminals of each mux cell indicates the bit values of input and output data, respectively.

The data bit output from the lowest F mux cell of first multiplexer 400 is FILL[0], and the data bit output from a sixth lowest F mux cell is FILL[5], and so on.

According to Table 1, when fill data control signals C1 and C2 of first multiplexer 400 are both at logic low levels, first multiplexer 400 output is 00000000 regardless of the data value of the double word fill data DW.

To left shift input data by 5 bits, shift control signals M0, M1, and M2 have values equal to 1, 0 and 1, respectively. Since M0 is at a logic high, control signals CT0 and CT1 are decoded (decoder circuit is not shown) to 0 and 1, respectively. Since M1 and M2 are at a logic low and high, respectively, control signals CT2, CT3, CT4, and CT5 are decoded to 0, 0, 1 and 0, respectively.

Accordingly, mux 2 cells 421 to 424 receive 0 and 1 for control signals CT0 and CT1, select bit IN[n] input to the second input terminal, and produce this second input terminal bit IN[n] to the output terminal as shown in FIG. 4A. Likewise, F mux 2 cells 425 to 428 select FILL[n] bits received to the first and second input terminals according to values 0 and 1 of control signals CT0 and CT1. Thereafter, F mux 2 cells produce the data bit received to the first input terminal and the data bit received to the second input terminal to the first output terminal and the second output terminal, respectively.

When shift control signals M1 and M2 are 0 and 1, respectively, decoded control signals CT2, CT3, CT4, and CT5 of third multiplexer 440 have 0, 0, 1, and 0 values, respectively. Given the above-mentioned control signals, mux 3 cells 441 to 448 of third multiplexer 440 select the bit received to the third input terminal and produce the selected bit to the mux 3 cell output terminal.

Let input data IN and double word fill data DW be 8 bits long equal to 01001101 and 00110110, respectively. First multiplexer 400 fixes the fill data to 0 corresponding to control signal C1 and C2 values of 0 and 0 and produces fixed fill data.

Mux 2 cells 421 to 424 select a bit received to a first input terminal as shown in FIG. 4A and produce the selected bit. F mux 2 cells 425 to 428 select the first and second input terminals as shown in FIG. 4A and produce the selected bits to the first and second output terminals, respectively. The mux 3 cells 441 to 448 of the third multiplexer 440 select a bit received to the third input terminal and produce the selected bits.

Accordingly, input data IN[0:7] 01001101 is shifted left by 5 bits and the empty place left due to shifted is filled with 0. The resulting output data has a value of 10100000. Fourth multiplexer 124 shown in FIG. 1 selects the left-shifted data when the value of the control signal H is 1, and produces the shifted data when control signal F is set to 1. Moreover, if control signal F is set to 0, fourth multiplexer 124 outputs the double word fill data 00110110.

According to the high-speed barrel shifter of the present invention, shifted data is produced without adding logic circuitry for fill data, thereby providing a high speed data shift function having little time delay.

What is claimed is:

1. A high speed barrel shifter comprising:
    a first multiplexer having a first and a second input terminals for receiving double word and input data, thereby producing fill data at a first multiplexer output terminal responsive to first and second fill data control signals (C1, C2);
    a second multiplexer coupled to said first multiplexer for receiving the fill data output from said first multiplexer and the input data and producing first shifted data by shifting the input data by a selectable number of either 0 or 4 bits and by replacing selectable input data bits with selectable fill data bits responsive to a first shift control signal (M0);
    a third multiplexer coupled to said second multiplexer for receiving the first shifted data output from said second multiplexer and producing second shifted data by shifting the first shifted data by a selectable number of either 0, 1, 2, or 3 bits responsive to second and third shift control signals (M1, M2); and
    a fourth multiplexer coupled to said first and third multiplexer for receiving the fill data output from said first multiplexer and the second shifted data output from said third multiplexer and selecting output data responsive to a first and second output select control signals (F, H).

2. A high speed barrel shifter according to claim 1, wherein said first multiplexer includes a plurality of F mux cells, each of said F mux cells comprises:
    a first control portion for producing ground potential at an F mux cell output terminal responsive to a first fill data select control signal (D0);
    a second control portion for producing a bit of the double word data at the F mux cell output terminal responsive to a second fill data select control signal (D1);
    a third control portion for producing a bit of the input data at the F mux cell output terminal responsive to a third fill data select control signal (D2);
    a fourth control portion coupled to said first, second, and third control portions for producing an output data bit at the F mux cell output terminal responsive to a first and a second transistor select signals (P_SEL, N_SEL); and
    an output buffer portion coupled to said fourth control portion for stabilizing the output data bit from said fourth control portion.

3. A high speed barrel shifter according to claim 1, wherein said second multiplexer includes a left_04 block and a right_04 block for shifting bits of the input data left or right, respectively, by a selectable number of either 0 or 4 bits.

4. A high speed barrel shifter according to claim 3 wherein each of said left_04 block and right_04 block comprises:
    a plurality of F mux 2 cells, each of the F mux 2 cells having a first, a second, and a third F mux 2 cell input terminals for receiving input and fill data bits output from said first multiplexer; and
    a plurality of mux 2 cells, each of the mux 2 cells having a first and a second mux 2 cell input terminals for receiving the input data bits.

5. A high speed barrel shifter according to claim 4 wherein each of the F mux 2 cells further comprises:
    a fifth control portion for transmitting a fill data bit received to the second F mux 2 cell input terminal to a first F mux 2 cell output terminal responsive to a first control portion select signal (CT0);
    a sixth control portion for transmitting an input data bit received to the third F mux 2 cell input terminal to a second F mux 2 cell output terminal responsive to the first control portion select signal (CT0);
    a seventh control portion for transmitting a fill data bit received to the first F mux 2 cell input terminal to the first F mux 2 cell output terminal responsive to a second control portion select signal (CT1); and an eighth control portion for transmitting the fill data bit received to the second F mux 2 cell input terminal to the first F mux 2 cell output terminal responsive to the second control portion select signal (CT1).

6. A high speed barrel shifter according to claim 4 wherein each of said mux 2 cells comprises:

a ninth control portion for transmitting an input data bit received to the second mux 2 cell input terminal to a mux 2 cell output terminal responsive to a first control portion select signal (CT0); and a tenth control portion for transmitting an input data bit received to the first mux 2 cell input terminal to the mux 2 cell output terminal responsive to a second control portion select signal (CT1).

7. A high speed barrel shifter according to claim 1, wherein said third multiplexer includes a left_0123 block and a right_0123 block for shifting input data bits left or right, respectively, by a selectable number of either 0, 1, 2, or 3 bits.

8. A high speed barrel shifter according to claim 7, wherein said left_0123 block and right_0123 block each comprise a plurality of mux 3 cells, each of said mux 3 cells including a 4 to 1 multiplexer responsive to third (CT2), fourth (CT3), fifth (CT4), and sixth (CT5) control portion select signals.

9. A high speed barrel shifter comprising:

first multiplexing means for receiving double word and input data and producing at its output fill data responsive to first and second fill data control signals (C1, C2);

second multiplexing means for receiving the fill data output from said first multiplexing means and the input data and producing at its output first shifted data by shifting input data either left or right by a selectable number of either 0 or 4 bits and by replacing selectable data bits of the input data with selectable bits of the fill data responsive to a first shift control signal (M0); and third multiplexing means for receiving the first shifted data output from said second multiplexing means and producing at its output second shifted data by shifting the first shifted data either left or right by a selectable number of either 0, 1, 2, or 3 bits responsive to a second and third shift control signals (M1, M2).

10. The high speed barrel shifter of claim 9 further comprising fourth multiplexing means for producing at its output either the fill data output from said first multiplexing means or the second shifted data output from said third multiplexing means responsive to a first output select control signal (F).

11. The high speed barrel shifter of claim 10 wherein said fourth multiplexing means further includes producing at its output either the right or the left shifted data output from said third multiplexing means responsive to a second output select control signal (H).

12. The high speed barrel shifter of claim 9 wherein said first multiplexing means includes a plurality of F mux cells, each F mux cell comprising:

a first control portion for producing ground potential at an F mux cell output terminal responsive to a first fill data select signal (D0);

a second control portion having a first F mux cell input terminal for receiving a double word bit and producing the double word bit at the F mux cell output terminal responsive to a second fill data select signal (D1);

a third control portion having a second F mux cell input terminal for receiving an input data bit and producing the input data bit at the F mux cell output terminal responsive to a third fill data select signal (D2); and a fourth control portion for producing a power supply voltage at the F mux cell output terminal responsive to a first enable signal (P_SEL).

13. The high speed barrel shifter of claim 9 wherein said second multiplexing means comprises:

a right_04 block for shifting the input data right by either 0 or 4 bits; and a left_04 block for shifting the input data left by either 0 or 4 bits;

wherein said right_04 block and said left_04 block each comprise a plurality of F mux 2 cells and a plurality of mux 2 cells.

14. The high speed barrel shifter of claim 13 wherein each of said F mux 2 cells comprises:

a fifth control portion for transmitting a first shifted data bit received to a second F mux 2 cell input terminal to a first F mux 2 cell output terminal responsive to a first portion control signal (CT0);

a sixth control portion for transmitting an input data bit received to a third F mux 2 cell input terminal to a second F mux 2 cell output terminal responsive to the first portion control signal (CT0);

a seventh control portion for transmitting a first shifted data bit received to a first F mux 2 cell input terminal to the first F mux 2 cell output terminal responsive to a second portion control signal (CT1); and an eighth control portion for transmitting a first shifted data bit received to the second F mux 2 cell input terminal to the second F mux 2 cell output terminal responsive to the second portion control signal (CT1).

15. The high speed barrel shifter of claim 14 wherein each of said mux 2 cells comprises:

a ninth control portion for transmitting an input data bit received to a second mux 2 cell input terminal to a mux 2 cell output terminal responsive to a first portion control signal (CT0); and a tenth control portion for transmitting an input data bit received to a first mux 2 cell input terminal to the mux 2 cell output terminal responsive to the second portion control signal (CT1).

16. A high speed barrel shifter comprising:

a first multiplexer for receiving input and double word data and producing fill data at its output responsive to first and second fill data control signals (C1, C2);

a second multiplexer having a left_04 block and a right_04 block for shifting the input data left or right, respectively, by either 0 or 4 bits and replacing selectable input data bits with fill data bits output from said first multiplexer responsive to a first shift control signal (M0);

a third multiplexer having a left_0123 block and a right_0123 block for shifting the data output from said second multiplexer left or right, respectively, by either 0, 1, 2, or 3 bits responsive to a second shift control signal (M1); and a fourth multiplexer for selecting among data received from the left_0123 block and the right_0123 block of said third multiplexer and the fill data output from said first multiplexer and producing at its output the selected data responsive to a first and a second output select control signals (F, H).

17. The high speed barrel shifter of claim 16 wherein the first multiplexer comprises a plurality of F mux cells, each F mux cell comprising:

a first control portion having a first transmission gate and a first inverter, the first transmission gate having an input terminal for receiving ground potential, the first control portion transmitting the ground potential to an F mux cell output terminal responsive to a first fill data select signal (D0);

a second control portion having a second transmission gate and a second inverter, the second transmission gate having an input terminal for receiving an input data bit, the second control portion transmitting the input data bit to the F mux cell output terminal responsive to a second fill data select signal (D1);

a third control portion having a third transmission gate and third inverter, the third transmission gate having an input terminal for receiving a double word data bit, the third control portion transmitting the double word data bit to the F mux cell output terminal responsive to a third fill data select signal (D2); and a fourth control portion having a PMOS transistor for producing a power supply voltage at the F mux cell output terminal and an NMOS transistor for producing ground potential at the F mux cell output terminal responsive to a PMOS (P_SEL) and an NMOS (N_SEL) transistor select signal, respectively.

18. The high speed barrel shifter of claim 17 wherein each of the left_04 block and the right_04 block comprise a plurality of F mux 2 cells responsive to first (CT0) and second (CT1) portion control signals decoded from the first shift control signal (M0), each F mux 2 cell comprising:

a fifth control portion having a fourth transmission gate and a fourth inverter for transmitting a data bit received to a second F mux 2 cell input terminal to a first F mux 2 cell output terminal responsive to the first portion control signal (CT0);

a sixth control portion having a fifth transmission gate for transmitting a data bit received to a third F mux 2 cell input terminal to a second F mux 2 cell output terminal responsive to the first portion control signal (CT0);

a seventh control portion having a sixth transmission gate and a fifth inverter for transmitting a data bit received to a first F mux 2 cell input terminal to the first F mux 2 cell output terminal responsive to the second portion control signal (CT1); and an eighth control portion having a seventh transmission gate for transmitting a data bit received to the second F mux 2 cell input terminal to the second F mux 2 cell output terminal responsive to the second portion control signal (CT1).

19. The high speed barrel shifter of claim 18 wherein each of the left_04 block and the right_04 block further comprise a plurality of mux 2 cells responsive to the first (CT0) and second (CT1) portion control signals, each mux 2 cell comprising:

a ninth control portion having an eighth transmission gate and a sixth inverter for transmitting a data bit received to a second mux 2 cell input terminal to a mux 2 cell output terminal responsive to the first portion control signal (CT0); and a tenth control portion having a ninth transmission gate and a seventh inverter for transmitting a data bit received to a first mux 2 cell input terminal to the mux 2 cell output terminal responsive to the second portion control signal (CT1).

20. The high speed barrel shifter of claim 19 wherein said the left_0123 block and the right_0123 block each comprise a plurality of mux 3 cells responsive to third (CT2), fourth (CT3), fifth (CT4), and sixth (CT5) portion control signals decoded from the second (M1) and third (M2) shift control signals, each mux 3 cell comprising a 4 to 1 multiplexer.

* * * * *